United States Patent
Sung

(10) Patent No.: US 7,164,298 B2
(45) Date of Patent: Jan. 16, 2007

(54) SLEW RATE ENHANCEMENT CIRCUIT VIA DYNAMIC OUTPUT STAGE

(75) Inventor: Kuang-Feng Sung, Taichung County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 10/707,354

(22) Filed: Dec. 8, 2003

(65) Prior Publication Data

US 2004/0178843 A1    Sep. 16, 2004

(30) Foreign Application Priority Data

Mar. 14, 2003    (TW) .............................. 92105571 A

(51) Int. Cl.
*H03K 3/00*    (2006.01)

(52) U.S. Cl. ......................................... 327/112; 326/87

(58) Field of Classification Search ........ 327/108–112, 327/170, 374, 376, 377; 326/85, 87
See application file for complete search history.

(56) References Cited

U.S. PATENT DOCUMENTS

| | | | | |
|---|---|---|---|---|
| 5,850,159 A | * | 12/1998 | Chow et al. ................. | 327/394 |
| 5,949,259 A | * | 9/1999 | Garcia .......................... | 327/111 |
| 5,977,790 A | * | 11/1999 | Sanwo et al. .................. | 326/27 |
| 6,177,814 B1 | * | 1/2001 | Taguchi ........................ | 327/58 |
| 6,236,239 B1 | * | 5/2001 | Kogushi ....................... | 326/88 |
| 6,304,120 B1 | * | 10/2001 | Taito ........................... | 327/170 |
| 6,320,433 B1 | * | 11/2001 | Hinterscher .................. | 327/112 |
| 6,329,873 B1 | * | 12/2001 | Morishita .................... | 327/541 |
| 6,351,149 B1 | * | 2/2002 | Miyabe ........................ | 326/87 |
| 6,396,316 B1 | * | 5/2002 | Cruz et al. ................... | 327/112 |
| 6,577,164 B1 | * | 6/2003 | Tomita ......................... | 326/86 |
| 6,606,271 B1 | * | 8/2003 | Hunt ..................... | 365/189.05 |
| 6,777,986 B1 | * | 8/2004 | Hidaka et al. ............... | 327/108 |
| 6,784,719 B1 | * | 8/2004 | Okamoto et al. ........... | 327/333 |

* cited by examiner

*Primary Examiner*—Kenneth B. Wells
(74) *Attorney, Agent, or Firm*—Jianq Chyun IP Office

(57) ABSTRACT

A slew rate enhancement circuit of an operational amplifier including a main output stage, a monitoring stage and an assistant output stage is provided. An input voltage of the operational amplifier is detected by the main output stage to decide whether to output a main current to the load or not. The main output stage also generators a first push signal and a first pull signal according to the input voltage, and thereafter the second push signal and second pull signal are level shifted by the monitoring stage. A second push signal and second pull signal will turn on or turn off the assistant output stage to decided whether to output an assistant current to the load or not. Specially, the improved compact circuit does not increase state operating current for the original operational amplifier and occupy a small chip area.

19 Claims, 3 Drawing Sheets

SLEW RATE ENHANCEMENT CIRCUIT VIA DYNAMIC OUTPUT STAGE

CROSS-REFERENCE TO RELATED APPLICATION

This application claims the priority benefit of Taiwan application Ser. No. 92105571, filed Mar. 14, 2003.

BACKGROUND OF THE INVENTION

1. Field of Invention

The present invention relates to a slew rate enhancement circuit. More particularly, the present invention relates to the slew rate enhancement circuit which is compact and occupies small chip area.

2. Description of Related Art

To achieve a high slew rate, when an operational amplifier ("OPAMP") drives a heavy load. Many techniques are used to enhance the slew rate, such as: increasing operating current of OPAMP, reducing a compensation capacitor, or being connected to an error amplifier. Except for the high slew rate, a lost of disadvantages such as a high operating current and a stability degradation for original OPAMP, a large chip area, complexity of circuit design, noise and offset are introduced from the followed error amplifiers.

FIG. 1 illustrates a high slew rate amplifier according to a prior art. The circuit in FIG. 1 includes an OPAMP 102, error amplifiers 104, 106 and a push-pull output stage 112. The push-pull output stage includes a P-type Metal Oxide Semiconductor ("PMOS") transistor 108 and an N-type Metal Oxide Semiconductor ("NMOS") transistor 110. The inverting inputs of the error amplifier 104 and the error amplifier 106 are connected to the output of the OPAMP 102 at a node N11. The non-inverting inputs of the error amplifier 104 and the error amplifier 106 are connected to a load at a node N12. The loop of connection between an output of the error amplifier 104 and the gate of the PMOS transistor 108, and the loop of connection between the drain of the PMOS transistor 108 and the non-inverting input of the error amplifier 104 formed a negative feedback loop. Likewise, the loop of connection between the output of the error amplifier 106 and the gate of the NMOS transistor 110, and the loop of connection between the drain of the NMOS transistor 110 and the non-inverting input of the error amplifier 106 also formed a negative feedback loop. The node N11 and the loop including node N12 construct a virtual short loop. The virtual short loop and both of the negative feedback loops are applied to control the PMOS transistor 108 to push current to the load or to control the NMOS transistor 110 to pull current from the load.

The error amplifier 104 and the error amplifier 106 are applied to monitor the output signals of the OPAMP 102. When a non-inverting input Vin10 is not equal to an inverting input Vout10, the error amplifier 104 and the error amplifier 106 turn on the PMOS transistor 108 to push a current to the load, or turn on the NMOS transistor 110 to pull a current from the load. On the other hand, when the signal Vin10 is equal to the signal Vout10, the PMOS transistor 108 and the NMOS transistor 110 work under the DC bias condition.

In general, the circuit of FIG. 1 is usually applied to a buffer amplifier. In order to provide a larger current from the PMOS transistor 108 and the NMOS transistor 110, aspect ratios of the PMOS transistor 108 and the NMOS transistor 110 should be as large as possible, but a static operating current is also increased according to the aspect ratio. Furthermore, a real circuit on a chip is more complicated than FIG. 1, since the error amplifier 104 is constructed by at least 5 pieces of Metal Oxide Semiconductor ("MOS") transistors, and so dose the error amplifier 106. If the Miller Compensation is applied to compensate the pole/zero location shifts, the other two compensation capacitors are introduced into the circuit of FIG. 1. If the offset voltage, symmetry of layout, cross distortion, linearity, bandwidth and noise of and from the error amplifier 104 and error amplifier 106 are calibrated, additional circuits will be added to the circuit of FIG. 1. Therefore, the manufacturing of the circuit of FIG. 1 on a chip will occupy a huge chip area and consume a high static operating current of the original OPAMP.

SUMMARY OF THE INVENTION

As embodied and broadly described herein, the invention provides an improved circuit, denoted as a dynamic output stage for enhancing of the slew rate. The original operational amplifier includes a differential amplifier and a main output stage. The dynamic output stage includes a monitoring stage and an assistant output stage. The main output stage detects an input voltage from a differential amplifier to decide whether to output a main current to the load or not. The main output stage also generates a push signal and a pull signal for the monitoring stage. The monitoring stage decays the push signal and the pull signal, and the assistant output stage will receive the decayed push signal and the decayed pull signal to decide whether to provide an assistant current to the load or not. The assistant current is an additional huge current for enhancing the slew rate. The assistant current is turned on/off automatically and will not affect the operation status of the original OPAMP and the main output stage. Furthermore, the dynamic stage does not consume the static operating current. Compared with the error amplifiers in the prior art, this invention will not introduce the offset voltage, compensation, distortion and noise. Therefore, no calibration will be needed.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
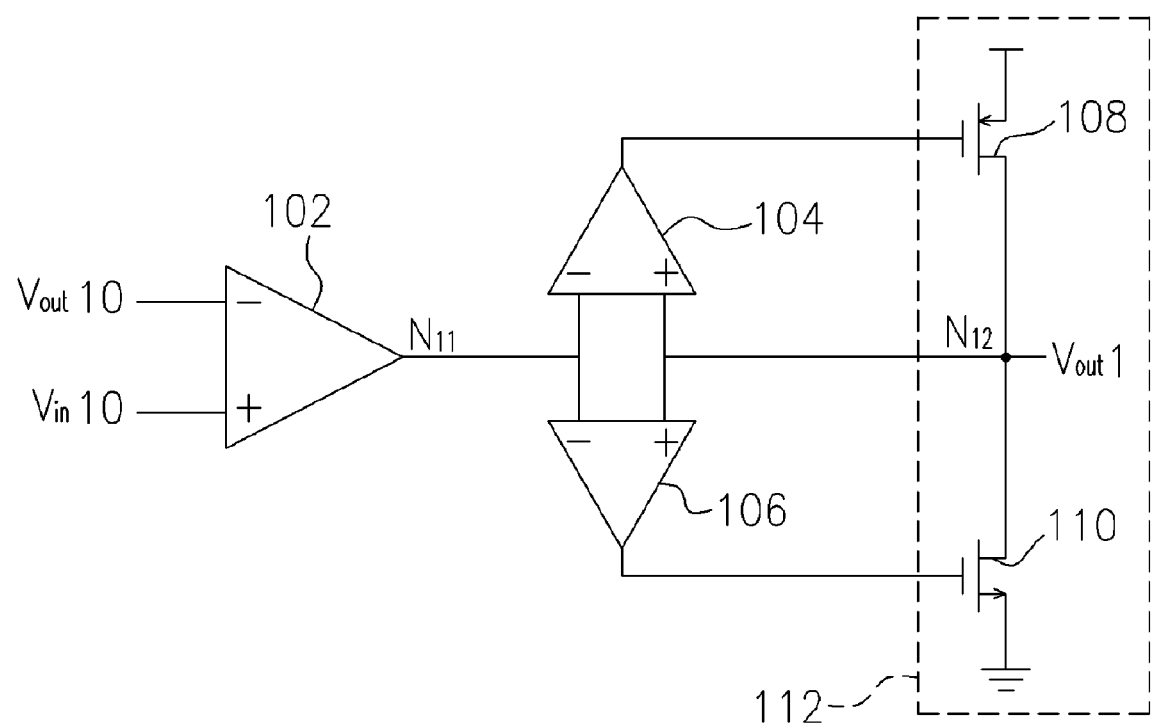
FIG. 1 is a conventional high slew rate amplifier.
Figure 2:
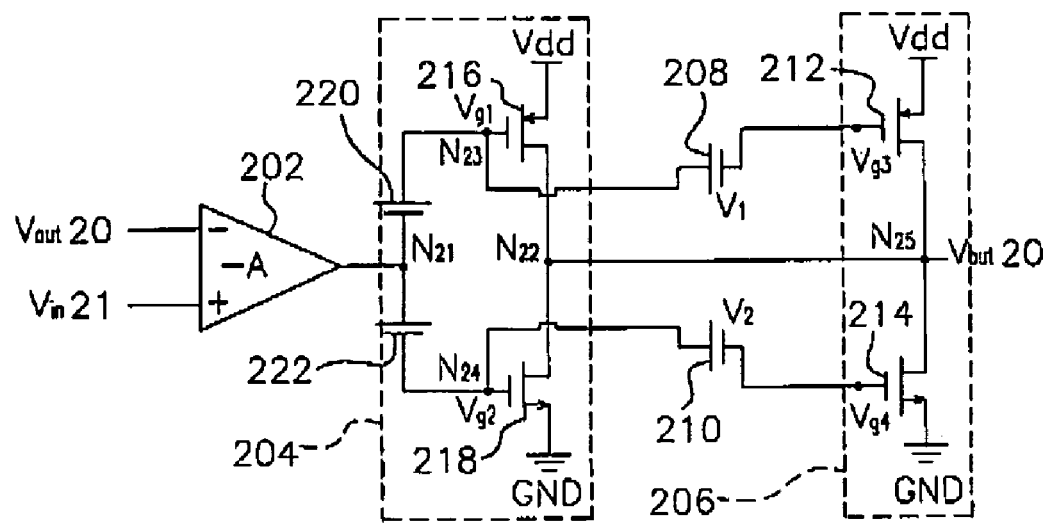
FIG. 2 is a sketch of the dynamic output stage of a preferred embodiment of the present invention.

FIG. 2 depicts of the dynamic output stage of a preferred embodiment of the present invention. An OPAMP includes a differential amplifier 202 and a main output stage 204. The differential amplifier has an inverting input, denoted as Vout 20 and a non-inverting input, denoted as Vin 21. The output of the differential amplifier, denoted as node N21, is connected to the main output stage 204. The main output stage 204 includes a plurality of sub-circuits; which comprises a voltage source 220, a first field effect transistor (FET) with a first type, for example, a first PMOS transistor 216, a voltage source 222 and a second FET with a second type, for example, a second NMOS transistor 218. The first and second field effect transistors provide the first push current and first pull current, respectively. The output of the differential amplifier 202 is connected to the voltage source 220 and the voltage source 222 at a node N21. The drain of the first PMOS transistor 216 is connected to the drain of the second NMOS transistor 218 at a node N22. The gate of the first PMOS transistor 216 is connected with the voltage source 220 and with a voltage source 208 at a node N23. A first push signal Vg1 is generated by the main output stage 204 at the node N23 and the signal Vg1 also stands for the voltage of the node N23. The source of the first PMOS transistor 216 is connected to an input power Vdd. The gate of the second NMOS transistor 218 is connected to the voltage source 222 and with a voltage source 210 at a node N24. A first pull signal Vg2 is generated by the main output stage 204 at the node N24 and the signal Vg2 also stands for the voltage of the node N24. The source of the second NMOS transistor 218 is connected to the ground. The voltage of the voltage source 208 is V1 and the voltage of the voltage source 210 is V2. An assistant output stage 206 includes a third FET with the first type, for example, a third PMOS transistor 212 and a fourth FET with the second type, for example, a fourth NMOS transistor 214. The third and fourth field effect transistors provide the second push current and second pull current, respectively. The drain of third PMOS transistor 212 is connected to the drain of the fourth NMOS transistor 214 at a node N25. The nose N22 is connected to the node N25 and the load. The gate of the third PMOS transistor 212 is connected to the voltage source 208 and the gate of the fourth NMOS transistor 214 is connected to the voltage source 210.

In a steady state, the voltage Vin 21 is equal to the voltage Vout20, the main output stage 204 does not apply any current to the load. A second push signal, i.e. level shifted push signal Vg3, denoting the gate voltage of the third PMOS transistor 212 is equal to the first push signal Vg1 minus the voltage V1. The voltage V1 is large enough, so the level shifted push signal Vg3 is not able to turn on the third PMOS transistor 212. Likewise, a second pull signal, i.e. level shifted pull shifted Vg4, denoting the gate voltage of the fourth NMOS transistor 214 is equal to the first pull signal Vg2 minus the voltage V2. The voltage V2 is large enough, so the level shifted pull signal Vg4 is not able to turn on the fourth NMOS transistor 214. No current will be applied to the load from the assistant output stage 206.

When the steady state no longer exists, the voltage Vin21 is larger than the voltage Vout20. The output node N21 of differential amplifier 202 will approach to the GND potential. The gate voltage N23 of the first PMOS 216 will approach to the GND potential, too. Thus, the first PMOS 216 will apply a main current to the load from node N22. The push signal Vg1 is fed forward to the assistant output stage 206 via the voltage source 208. The first push signal Vg1 is decayed by the voltage source 208, which results in a level shifted push signal Vg3. This level shifted push signal Vg3 will approach the GND potential, event though the potential voltage of Vg3 is 'Vg1+V1'. The decayed push signal is large enough to turn on the first PMOS 216.

Meanwhile, the gate voltage N24 of the second NMOS 218 will aproach to the GND potential, thus the second NMOS 218 is turned off. The first pull signal Vg2 is fed forward to the assistant output stage 206 via the voltage source 210. The first pull signal Vg2 is decayed by the voltage source 210, which results in a level shifted pull signal Vg4. This level shifted pull signal will approach the GND potential, and the fourth NMOS 214 is turned off. Therefore, the assistant output stage 206 will also apply an assistant current to the load from the node N25. When the voltage Vin21 turns into a little larger than the voltage Vout20, the gate voltage N23 of the first PMOS 216 and the gate voltage N24 of the second NMOS 218 will return to a steady state condition. Due to the voltage source 208 and 210, the assistant output stage 206 will turn off and no longer apply an assistant current to the load. The main output stage will apply current to the load until the voltage Vin21 equals Vout20.

When the voltage Vin 21 is smaller than the voltge Vout20, the output node N21 of differential amplifier 202 will approach to Vdd. The gate voltage N24 of the second NMOS 218 will approach to Vdd, too. Thus, the second NMOS 218 will apply a main curent to the load from node N22. The first pullsignal Vg2 is fed forward to the assistant output stage 206 via the voltage source 210. The first pull signal Vg2 is level shifted by the voltage source 210, which results in a level shifted push signal Vg4. This result in the level shifted pull signal Vg4 will approach to Vdd, even though the potential voltage of Vg4 is 'Vg2+V2'. The level shifted pull signal is large enough to turn on the NMOS 214. Meanwhile, the gate voltage N23 of the first PMOS 216 will approach to Vdd, thus the first PMOS 216 is turned off. The first push signal Vg1 is fed forward to the assistant output stage 206 via the voltage source 208. The first push signal Vg1 is level shifted by the voltage source 208, which results in a level shifted push signal Vg3. This level shifted pull signal will approach to Vdd, and the third PMOS 212 is turned off. Therefore, the assistant output stage will also apply an assistant current to the load from the node N25. When the voltage Vin21 turns into a little smaller than the voltage Vout20, the gate voltage N23 of the first PMOS 216 and the gate voltage N24 of the second NMOS 218 will return to a steady state condition. Due to the voltage source 208 and 210, the assistant stage 206 will turned off and no longer apply an assistant current to the load. The main output stage will apply current to the load until the voltage Vin21 equals Vout20. The novel technology presented above is the dynamic output stage.

Figure 3:
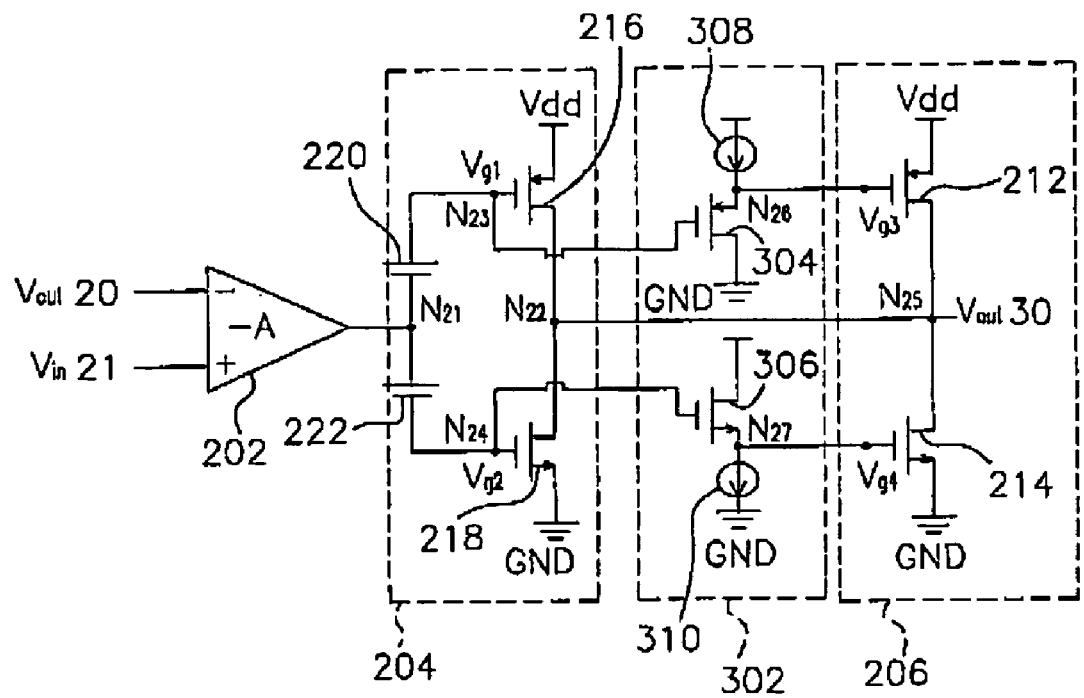
FIG. 3 is a detail circuit of the dynamic output stage of a preferred embodiment of the present invention.

FIG. 3 is a detail circuit of the dynamic output stage in the present invention, wherein the voltage sources 208 and 210 are replaced by a monitoring stage 302. The monitoring stage 302 includes a fifth FET with the first type, for example, a fifth PMOS transistor 304, a current source 308, a sixth FET with the second type, for example, a sixth NMOS transistor 306 and a current source 310. The gate of the fifth PMOS transistor 304 is connected to the gate of the first PMOS transistor 216 at the node N23. The source of the fifth PMOS transistor 304 is connected to the gate of the third PMOS transistor 212 and to the current source 308 at a node N26. The drain of the fifth PMOS transistor 304 is connected to the ground. The gate of the sixth NMOS transistor 306 is connected to the gate of the second NMOS transistor 218 at the node N24. The source of the sixth NMOS transistor 306 is connected to the gate of the fourth NMOS transistor 214 and to the current source 310 at a node N27. The other circuit devices and connections between these devices in FIG. 3 are the same as those in FIG. 2.

In FIG. 3, when the voltage Vin21 is equal to the voltage Vout20 in the steady state, the main output stage 204 does not apply any current to the load. The first PMOS transistor 216 and the second NMOS transistor 218 will work under the quiescent current bias condition so that even a voltage at the inverting input is equal to that at the non-inverting input, there exists a quiescent DC biased current at the node $N_{22}$. A voltage difference between the node N26 and the node N23 will be equal to a threshold voltage Vt1 of the fifth PMOS 304 at least. Likewise, the voltage difference between the node N27 and the node N24 will be at least equal to a threshold voltage Vt2 of the sixth NMOS 306. The first push signal Vg1 is decreased by the threshold voltage Vt1, and therefore the second push signal, i.e. level shifted push signal Vg3 will be equal to Vdd, thus the third PMOS transistor 212 will be turned off. The first pull signal Vg2 is also increased by the threshold voltage Vt2, and therefore the second pull signal, i.e. level shifted pull signal Vg4 will be equal to the ground, thus the third NMOS transistor 214 will also be turned off. Therefore, the assistant output stage will not apply any current to the load.

When the steady state no longer exists, the voltage Vin21 is larger than the voltage Vout20, the first pull signal Vg2 will approach the ground, and therefore the second NMOS transistor 218 will be turned off. The first push signal Vg1 will approach the ground, and therefore the first PMOS transistor 216 will be turned on. The result is that the main output stage 204 pushes a main current to the load. The level shifted push signal Vg3 is equal to the first push signal Vg1 plus the absolute value of the voltage difference between the gate and the source of the fifth PMOS transistor 304. Likewise, the level shifted pull signal Vg4 is equal to the first pull signal Vg2 minus the absolute value of the voltage difference between the gate and the source of the sixth NMOS transistor 306. Since the second NMOS transistor 218 is turned off, the fourth NMOS transistor 214 will also be turned off. The first PMOS transistor 216 is turned on, the level shifted push signal Vg3 is able to turn on the third PMOS transistor 212 to push an external current to the load. The final result is that the assistant output stage will push an assistant current to the load. When the load Vin21 turns into a little larger than the voltage Vout20, the push signal Vg1 and the pull signal Vg2 will return to a quiescent bias condition. Since Vg1 and Vg2 is level shifted by the fifth PMOS 304 and the sixth NMOS transistor 306, the second push signal Vg3 and the second pull signal Vg4 will be not enough to turn on the third PMOS transistor 212 and the fourth NMOS transistor 214. Therefore the assistant output stage will not apply any current to the load. The load will be driven by the current from the main output stage 204 till the voltage Vin21 equals the Vout20.

When the steady state no longer exists, the voltage Vin21 is smaller than the voltage Vout20, the push signal Vg1 will approach to Vdd, and therefore the first PMOS transistor 216 will be turned off. The first pull signal Vg2 will approach to Vdd, and therefore the second NMOS transistor 218 will be turned on. The result is the main output stage 204 will pull a main current from the load. Since the first PMOS transistor 216 is turned off, the third PMOS transistor 212 will also be turned off. The second NMOS transistor 218 is turned on, the level shifted pull signal Vg4 is able to turn on the fourth NMOS transistor 214 to pull an external current from the load. The final result is that the assistant output stage will pull an assistant current from the load. When the voltage Vin21 turns into a little smaller than the voltage Vout20, the first push signal Vg1 and the first pull signal Vg2 will return to the quiescent bias condition. Since Vg1 and Vg2 are level shifted by the fifth PMOS transistor 304 and the sixth NMOS transistor 306, the second push signal Vg3 and the second pull signal Vg4 will be not enough for the third PMOS transistor 212 and the fourth NMOS transistor 214. Therefore, the assistant output stage will not pull any current from the load. The load will be driven by the current from the main output stage 204 till the voltage Vin21 equals the Vout20.

The assistant output stage is an apparatus, which could provide the extra current to the load. The assistant output stage is controlled by the fifth PMOS transistor 304 and the sixth NMOS transistor 306, which operate as a source follower. Thus, the assistant output stage will be turned on after the main output stage is turned on, and be turned off before the main output stage is turned off. The assistant output stage is turned on/off automatically, and furthermore the assistant output stage does not consume the static operating current. The problem of prior art, such as: offset voltage, pole/zero location, and linearity, will no longer exist. The slew rate of operational amplifier is increased without consuming the extra operating current and degrades stability.

Figure 4:
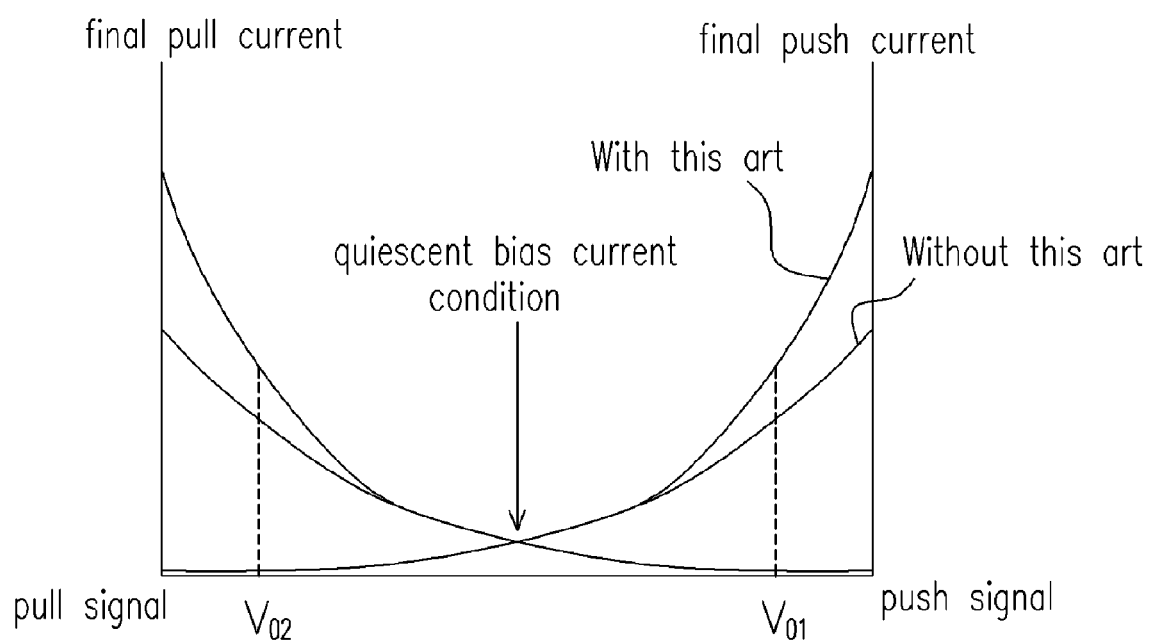
FIG. 4 is the graph of the final push current and the final pull current at the node N25 versus the push and pull signal of OPAMP with and without this invention.

FIG. 4 is the graph of the final push current and the final pull current at the node N25 versus the push and pull signal of OPAMP with and without this invention. The final push current and the final pull current are obviously increased by the assistant output stage. In FIG. 4, the push current with this invention is larger than the push current without this invention under the same push signal V01. Likewise, the pull current with this invention is larger than the pull current without this invention under the same pull signal V02. Therefore, the final push current or pull current is higher for the original OPAMP with this invention. With the dynamic output stage in this invention, it is easy to enhance the slew rate without increasing static operating current of the original OPAMP.

Accordingly, the circuit and method provided in the present invention can be used to any circuit having at least two inputs, for example, a first input and a second input and a main current. The method of the invention includes that, first of all, detecting a first input and a second input. Secondly, a push current is generated when a voltage of the second input is larger than a voltage of the first input and their difference is large enough to turn on at least one of the switches. Otherwise, a pull current is generated when a voltage of the first input is larger than a voltage of the second input and their difference is large enough to turn on at least one of the switches. Thus, the push circuit and the pull circuit can be used to enlarge the main current to enhance the slew rate. Moreover, the push current and the pull current are further fed back to one of the first input and the second input. Furthermore, the push current and the pull current is turned on automatically after the main current is turned on, and is turned off automatically before the main current is turned off.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A circuit for enhancing a slew rate of an operational amplifier by providing an assistant current to a main output stage outputting a main current, comprising:

a monitoring stage for receiving signals from the main output stage and outputting a push signal and a pull signal, wherein the main output stage comprises a first field effect transistor with a first type and a second field effect transistor with a second type, the gates of the first and second field effect transistors are connected to an output of a differential amplifier and the main current further comprises a quiescent DC biased current, and the push signal and the pull signal are level shifted from the output of the differential amplifier; and an assistant output stage comprising a third field effect transistor with the first type and a fourth field effect transistor with the second type, wherein a first input and a second input of the monitoring stage are connected to the gate of the first field effect transistor with the first type and the gate of the second field effect transistor with the second type, respectively, so as to receive signals from the main output stage, and then a first output and a second output of the monitoring stage are connected to the gate of the third field effect transistor with the first type and the gate of the fourth field effect transistor with the second type, respectively, so as to output the push signal and the pull signal to the assistant output stage.

2. The circuit of claim 1, wherein the monitoring stage comprises a fifth field effect transistor with the first type and a sixth field effect transistor with the second type.

3. The circuit of claim 1, wherein the assistant current is turned on automatically after the main current is turned on.

4. The circuit of claim 1, wherein the assistant current is turned off automatically before the main current is turned off.

5. The circuit of claim 1, wherein the first type is P type and the second type is N type.

6. The circuit of claim 1, wherein the first type is N type and the second type is P type.

7. The circuit of claim 1, wherein the voltage of the push signal is higher than the voltage of the first input of the monitoring stage, and the voltage of the pull signal is lower than the voltage of the second input of the monitoring stage.

8. The circuit of claim 1, wherein the voltage of the push signal is lower than the voltage of the first input of the monitoring stage, and the voltage of the pull signal is higher than the voltage of the second input of the monitoring stage.

9. A method for enhancing a slew rate of an operational amplifier, comprising:

generating a first pull current and a first push current from a main output stage, wherein the main output stage comprises a first field effect transistor with a first type and a second field effect transistor with a second type, the gates of the first and the second field effect transistors are connected to a first output and a second output of a differential amplifier;

the first output voltage of the differential amplifier turning on the first field effect transistor with the first type so as to generate the first push current, and the second output voltage of the differential amplifier turning on the second field effect transistor with the second type so as to generate the first pull current, wherein the first push current and the first pull current further comprises a quiescent DC biased current;

generating a second push current when the first output voltage of the differential amplifier passes through a fifth field effect transistor with the first type to the gate of a third field effect transistor with the first type;

generating a second pull current when the second output voltage of the differential amplifier passes through the gate of a sixth field effect transistor with the second type to the gate of a fourth field effect transistor with the second type, whereby the second push current or the second pull current is generated as an assistant current when either the third field effect transistor with the first type is turned on or the fourth field effect transistor with the second type is turned on.

10. The method of claim 9, wherein the second push current or the second pull current is turned on automatically after the main current is turned on.

11. The method of claim 9, wherein the second push current or the second pull current is turned off automatically before the main current is turned off.

12. The method of claim 9, wherein the first type is P type and the second type is N type.

13. The method of claim 9, wherein the first type is N type and the second type is P type.

14. A circuit for enhancing a slew rate of an operational amplifier by providing an assistant current to a main output stage outputting a main current, comprising:

a monitoring stage, comprising a first DC voltage source for generating a push signal and a second DC voltage source for generating a pull signal, wherein a first end of the first DC voltage source is connected to the gate of a first field effect transistor with a first type, a first end of the second DC voltage source is connected to the gate of a second field effect transistor with a second type, the first and second field effect transistors constitute the main output stage, the gates of the first and second field effect transistors are connected to an output of a differential amplifier and the main current further comprises a quiescent DC biased current; and an assistant output stage, comprising a third field effect transistor with the first type and a fourth field effect transistor with the second type, wherein a second end of the first DC voltage source DC voltage source is connected to the gate of the fourth field effect transistor, whereby the assistant current is generated when either the third field effect transistor is turned on or the fourth field effect transistor is turned on.

15. The circuit of claim 14, wherein the main current further comprises a quiescent DC biased current.

16. The circuit of claim 14, wherein the assistant current is generated when either the third field effect transistor is turned on or the fourth field effect transistor is turned on.

17. The circuit of claim 14, wherein the first type is P type and the second type is N type.

18. The circuit of claim 14, wherein the first type is N type and the second type is N type.

19. A circuit for enhancing a slew rate of an operational amplifier by providing an assistant current to a main output stage outputting a main current, comprising:

a monitoring stage for receiving signals from the main output stage and outputting a push signal and a pull signal, wherein the main output stage comprises a first field effect transistor with a first type and a second field effect transistor with a second type, the gates of the first and second field effect transistors are connected to an output of a differential amplifier and the main current further comprises a quiescent DC biased current; and an assistant output stage comprising a third field effect transistor with the first type and a fourth field effect transistor with the second type, wherein a first input and a second input of the monitoring stage are connected to the gate of the first field effect transistor with the first type and the gate of the second field transistor with the second type, respectively, so as to receive signals from the main output stage, and then a first output and a second output of the monitoring stage are connected to the gate of the third field effect transistor with the first type and the gate of the fourth field effect transistor with the second type, respectively, so as to output the push signal and the pull signal to the assistant output stage;

wherein the monitoring stage comprises a first voltage source to generate the push signal by level shifting the voltage of the first input of the monitoring stage, and a second voltage source to generate the pull signal by level shifting the voltage of the second input of the monitoring stage.

* * * * *